United States Patent [19]

Ogawa et al.

[11] Patent Number: 4,883,562
[45] Date of Patent: Nov. 28, 1989

[54] METHOD OF MAKING A PHOTOSENSOR

[75] Inventors: Hirofumi Ogawa; Kenji Sameshima, both of Hachioji; Tadaaki Hirai, Koganei; Takaaki Unnai; Masanao Yamamoto, both of Mobara; Keiichi Shidara, Tama; Junichi Yamazaki, Kawasaki; Eikiyu Hiruma, Komae; Shirou Suzuki, Yokosuka, all of Japan

[73] Assignees: Hitachi, Ltd.; Nippon Hoso Kyokai, both of Tokyo, Japan

[21] Appl. No.: 301,467

[22] Filed: Jan. 26, 1989

[30] Foreign Application Priority Data

Jan. 28, 1988 [JP] Japan .................................. 63-15940

[51] Int. Cl.[4] ..................... B44C 1/22; C03C 15/00; C03C 25/06
[52] U.S. Cl. .................................. 156/643; 156/646; 156/663; 156/345; 204/192.26; 204/192.3; 204/192.37
[58] Field of Search ............... 156/643, 646, 663, 345; 204/192.26, 192.29, 192.3, 192.32, 192.35, 192.37, 298; 437/2, 3, 5

[56] References Cited

U.S. PATENT DOCUMENTS 4,581,099 4/1986 Fukaya et al. ..................... 437/3 X

FOREIGN PATENT DOCUMENTS 4924619 3/1974 Japan .

OTHER PUBLICATIONS

Tanioka et al., "High Gain Photoconductive Target For Camera Tube", ITEJ Technical Report, vol. 10, No. 44, pp. 1-6, Jan. 1987.

Primary Examiner—William A. Powell
Attorney, Agent, or Firm—Antonelli, Terry & Wands

[57] ABSTRACT

A method of making an image pickup tube target (FIG. 1A), etc., using an amorphous photoconductive layer. When an electrode, an amorphous semiconductor layer, etc., are provided on a substrate, the steps of ion etching away a surface of the substrate and forming the electrode are performed so that a target (FIG. 1A) is produced in which no defects are substantially caused in a reproduced image even if a high electric field is applied across the target.

12 Claims, 10 Drawing Sheets

FIG. IA
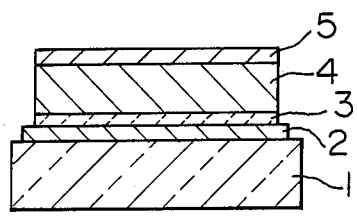
FIG. IB
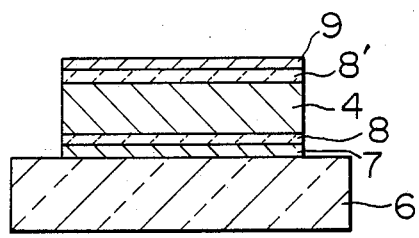

LIGHT

METHOD OF MAKING A PHOTOSENSOR

BACKGROUND OF THE INVENTION

1. Field of the Invention

The present invention relates to a method of making a photosensor such as an image pickup tube, a one- or two-dimensional line sensor, and more particularly to a method of making a photosensor having a photoconductive layer essentially made of an amorphous semiconductor.

2. Description of the Prior Art

An image pickup tube as one of photosensors will now be described. An image pickup tube using a photoconductive layer of an amorphous semiconductor is described in, for example, Japanese Patent No. 902189 corresponding to Japanese Patent Unexamined Publication JP-A No. 49-24619. In order to use an image pickup tube of such type at high sensitivity, techniques in which a high electric field is applied across the photoconductive layer of the image pickup tube to thereby cause avalanche multiplication of charges in the photoconductive layer are disclosed in ITEJ (Institute of Television Engineers of Japan) Technical Report, Vol. 10, No. 45, pp. 106, ED-'87 (1987).

SUMMARY OF THE INVENTION

The above prior art does not take into consideration the use of an image pickup tube under conditions severer than usual ones, so that there is the problem that defects such as white blemishes may occur on the picture. For example, if the image pickup tube is used under conditions in which avalanche multiplication may occur, namely, if a high electric field is applied across the photoconductive target of the image pickup, the above problem is especially likely to occur.

It is an object of the present invention to provide a photosensor having a photoconductive layer which will cause no picture defects.

The above object is achieved by a method of making a photosensor, comprising the steps of preparing for at least a predetermined substrate, forming an electrode on the substrate, and forming on the electrode a photoconductive layer mainly made of an amorphous semiconductor such that the photoconductive layer is maintained in rectifying contact with the electrode, characterized by the step of ion etching away the substrate surface performed before the step of forming the electrode, that the step of the forming the electrode includes evaporating a metal material mainly containing indum in an atmospheric gas mainly containing oxygen, or by both of these steps.

BRIEF DESCRIPTION OF THE DRAWINGS

FIGS. 1A and 1B illustrate the basic structure of a photosensor obtained by carrying out the present invention;

DESCRIPTION OF THE PREFERRED EMBODIMENT

Figure 2:
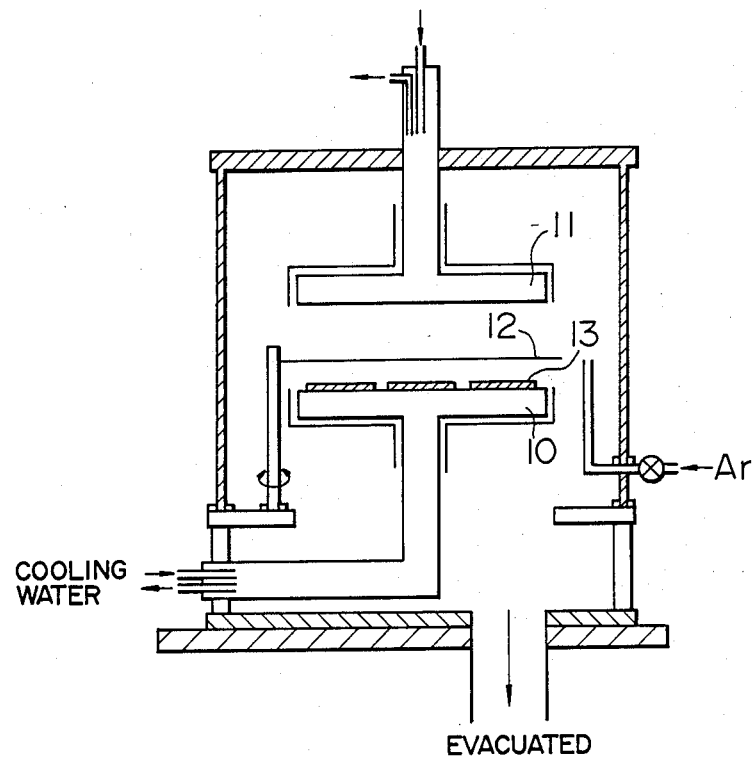
FIG. 2 schematically illustrates one example of an RF sputtering apparatus used for carrying out the present invention.

FIGS. 1A and 1B illustrate one example of the basic structure of a photosensor obtained by the carrying out the invention. FIG. 1A shows the basic structure of a photoconductive target for an image pickup tube of a so-called blocking structure and FIG. 1B shows the basic structure of a one- or two-dimensional solid state sensor. Reference numeral 1 denotes a transparent substrate; 2, a transparent electrode; 3, a hole blocking layer; 4, a photoconductive film mainly made of an amorphous semiconductor; 5, an electron blocking layer; 6, a substrate; 7, a signal electrode; 8, 8', a carrier blocking layer which blocks the inflow of charges from the electrode to the photoconductive film; and 9, an electrode.

Very excellent effects are produced by beforehand etching away the surface of the substrate 1 or 6 by ion shocks, by forming on the substrate 1 or 6 a transparent electrode mainly made of indium oxide as the electrode 2 or 7 by vapor depositing a metal material mainly containing indium in an atmospheric gas mainly containing oxygen, or by using both of these steps.

The ion etching of the substrate surface is performed, for example, by setting the substrate on the target electrode side of an RF sputtering apparatus and performing RF discharge in an atmosphere mainly containing an inert gas such as argon or nitrogen. If the substrate is conductive, ion etching may be performed by direct current discharge. Alternatively, similar ion etching may also be performed using a quatrapole sputtering apparatus, a magnetron-type sputtering apparatus or a plasma asher.

The formation of a transparent electrode mainly made of indium oxide on a substrate by deposition may be performed by evaporating a metal material mainly containing indium by resistive heating method in a atmospheric gas mainly containing oxygen, by electron-beam deposition or by laser beam deposition. The atmospheric gas used in the deposition may contain, for example, not only oxygen but also steam, carbon dioxide, etc., or may be deluted with nitrogen, argon, etc. The metal material mainly containing indium may be an In-Sn alloy or the like or may additionally contain a trace of Cd, Zn, Ti, etc.

The electrode usually has a thickness of about 100–2000 Å and preferably about 300–1000 Å. The photoconductive film used in the present invention may be an amorphous semiconductor containing Se as a main component. Bi, Cd, Te, Sn, As, Ge, Sb, In, Ga, chalcogen compounds of these elements, S, Cl, I or Br may be added to the amorphous semiconductor in addition to Se. The addition of, for example, Te to Se to produce a redsensitization effect is disclosed in the afore mentioned Japanese Patent Unexamined Publication JP-A No. 49-24619 and of these resulting photoconductive films may be used. Other amorphous semiconductors may also be used. Various processes such as the formation of a mixed phase by adding a fine-crystal semiconductor to an amorphous semiconductor of the same component as that of the fine-crystal semiconductor or the formation of a laminate structure of these semiconductors may be used for a photoconductive film.

It is suspected that the substrate surface will have fine local effects even if the substrate is subjected to optical polishing or that regular cleaning cannot completely eliminate a trace of contamination. It is presumed that by ion etching the substrate surface is smoothed or purified or the picture defects are improved by the action of these steps. However, the true action is not clear and whether this presumption is correct or not does not at all influence the establishment of this invention.

The present invention will now be described by taking as an example the target of an image pickup tube shown in FIG. 1A.

FIG. 2 schematically illustrates one example of RF sputtering apparatus for ion etching away the surface of transparent glass substrates. Each substrate 13 (the transparent glass substrate 1 in FIG. 1A) is set on the target electrode 10 of the sputtering apparatus, which is then evacuated temporarily so as to achieve a high vacuum state, Ar gas is introduced into the apparatus, RF discharge is produced between the target electrode 10 and a substrate holder 11 while opening the shutter 12 and thus the substrate surface is etched away by discharged ions. Thereafter, a transparent electrode 2 is formed as shown in FIG. 1A.

Figure 3:
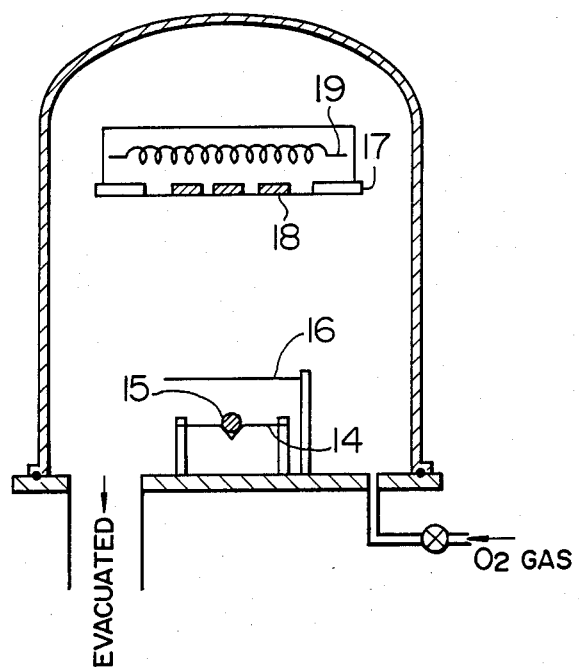
FIG. 3 schematically illustrates one example of a resistive heating deposition apparatus used for carrying out the present invention.

FIG. 3 schematically illustrates one of resistive heating deposition apparatus for forming the transparent electrode. Each of substrates 18 (the transparent glass substrate 1 in FIG. 1A) is set on a substrate holder 17, the apparatus is temporarily evacuated so as to achieve a high vacuum state, and the substrate 18 is heated by a heater 19 up to a predetermined temperature. Oxygen gas is introduced, electric power is supplied to a boat 14 to heat and evaporate a metal material 15 mainly containing indium to thereby form on the substrate 18 a transparent electrode mainly made of indium oxide.

After either one or both of the steps of ion etching away the substrate surface and forming the transparent electrode on the substrate, as mentioned above, are performed, a hole block layer 3, a photoconductive film 4 and an electron blocking layer 5 are sequentially deposited, as shown in FIG. 1A, this lamination is incorporated into an image pickup tube housing which has a built-in electron gun to thereby provide a photoconductive image pickup tube.

Figure 4:
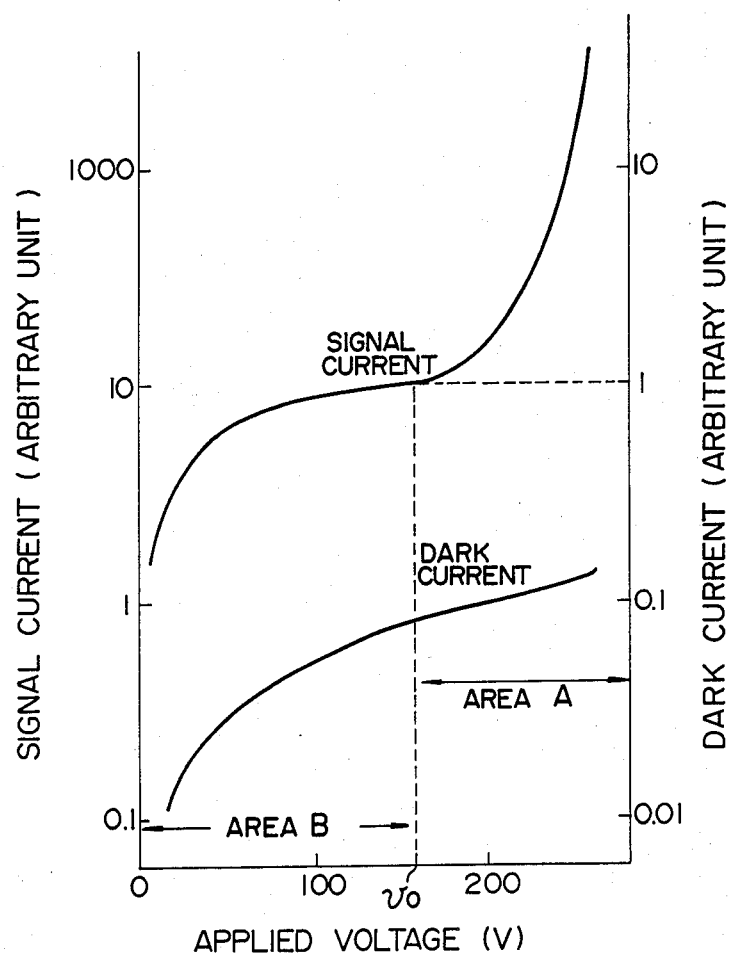
FIG. 4 is a graph of the current-voltage characteristic of an image pickup tube.
Figure 10:
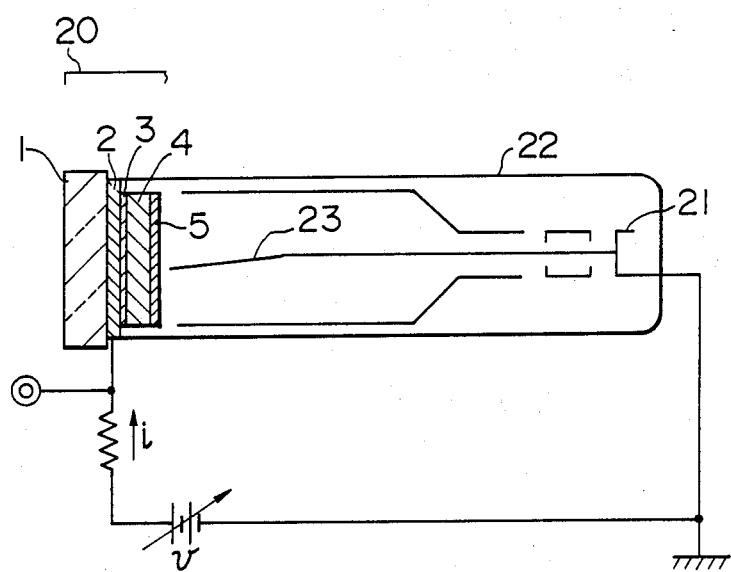
FIG. 10 is a schematic cross section view of a photoconductive image pickup tube.

FIG. 4 shows an illustrative current-voltage characteristic, i.e. the characteristic of a current i with variation of the voltage V as shown in FIG. 10, of a photoconductive pickup tube obtained by carrying out both of the steps of ion etching away the substrate surface and forming an electrode made of a material mainly including indium in an atmosphere of oxygen. In this case, the photoconductive layer uses an amorphous semiconductor mainly containing Se and having a thickness of 2 $\mu$m. As the voltage applied to the photoconductive layer increases, the signal current also increases and then exhibits a saturating tendency temporarily. As the applied voltage is further increased, charge multiplication occurs in the amorphous Se layer, the signal current rapidly increases and the gain exceeds 1 (unity). Reference character A denotes an avalanche multiplication area.

If the applied voltage is increased to larger than a certain valve $V_o$, for example 160 volts, i.e. the area A in a conventional image pickup tube, defects such as white blemishes are likely to occur on the monitor, but according to the image pickup tube obtained by carrying out the inventive making method, the picture defects are greatly reduced as well as the dark current is sufficiently suppressed and thus the photosensor is operable with a high voltage compared to the conventional photosensor to thereby produce a sufficient multiplication effect.

Figure 5:
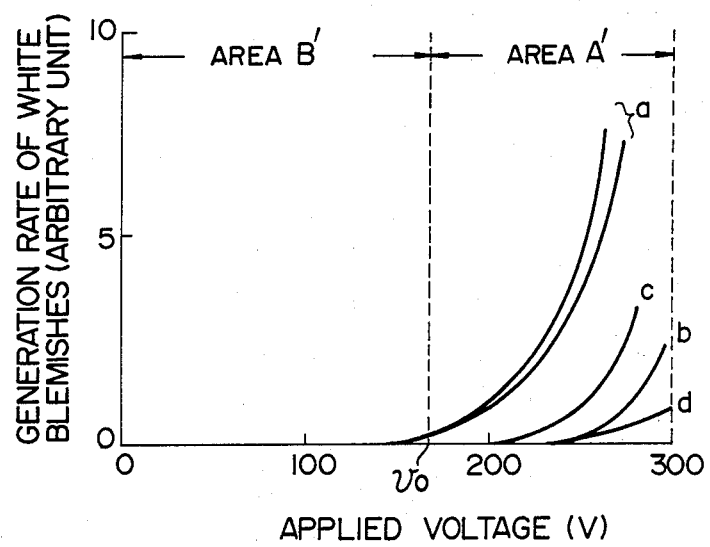
FIG. 5 shows a picture defect characteristic of the image pickup tube.

FIG. 5 illustrates one example of the effects of decreasing white blemishes in a photoconductive image pickup tube obtained by carrying out the present invention. In FIG. 5, reference character a denotes the voltage dependency of the generation rate of white blemishes in a photoconductive image pickup tube with a transparent tin oxide electrode formed by CVD on a glass substrate without ion etching away the substrate surface or with a transparent indium oxide electrode formed by sputtering. Reference characters b, c and d denote similar characteristics of photoconductive image pickup tubes according to the present invention wherein b, c and d are concerned with the image pickup tube with the ion-etched substrate surface, the image pickup tube with the transparent electrode mainly made of indium oxide and formed according to the inventive deposition process, and the image pickup tube obtained by performing both the step of ion etching away the substrate surface and the step of forming by deposition the transparent electrode mainly made of indium oxide, respectively, according to the present invention.

While the generation rate of picture defects is a very low and no difference is substantially noticed between them in a region B', i.e., a voltage region in which no charge multiplication occurs yet in the photoconductive film, white blemishes in the image pickup tube are reduced in an area A', namely, an operating voltage area in which charge multiplication occurs in the photoconductive film, as a result of carrying out the present invention. It is obvious that white blemishes are greatly reduced in the image pickup tube shown by the characteristic curve b and formed especially by the use of both of the step of ion etching away the substrate surface and the step of forming by vapor deposition the transparent electrode mainly made of indium oxide.

A quantity by which the substrate surface is ion etched away is preferably 0.1 to 10 $\mu$m. No effects are produced if the quantity is either too small or too much. What is worse, there is an undesirable possibility that fine granular new foreign matters may be deposited on the ion-etched substrate surface within the apparatus housing. The rate of ion etching is preferably 100 nm/min or less. Ion etching at a rate higher than 100 nm/min is likely to make the substrate surface rugged.

Figure 6:
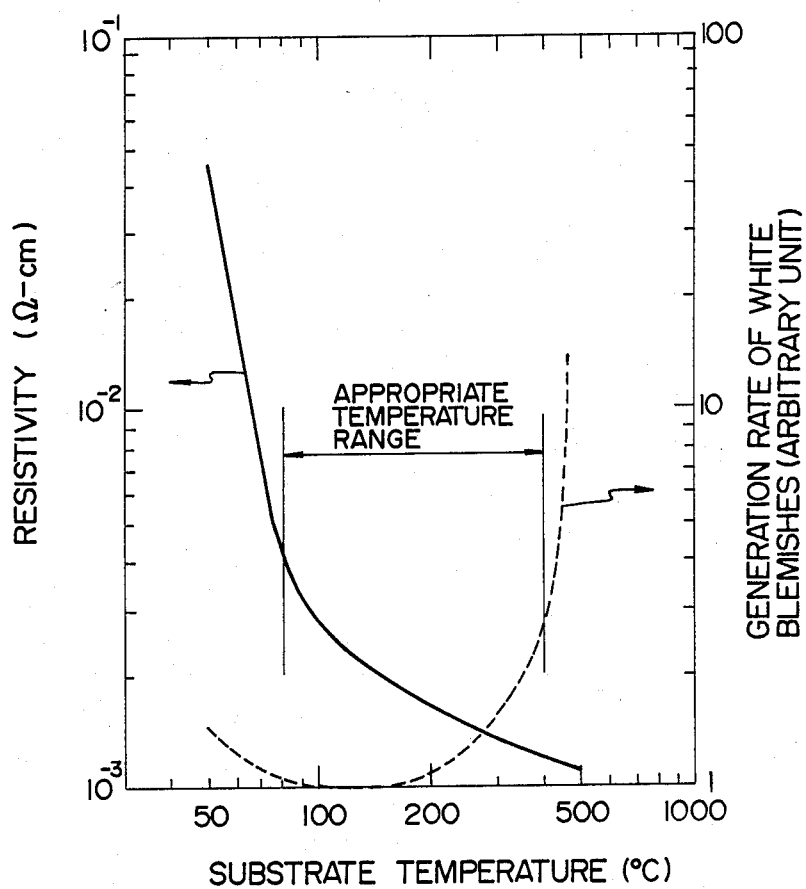
FIG. 6 illustrates the relationship among substrate temperature and resistivity in the formation of a transparent electrode according to the present invention and a picture defect characteristic of the resulting image pickup tube thereof.

FIG. 6 illustrates the relationship among the resistivity of a transparent electrode formed by the evaporation of an In - Sn alloy in which 5% by weight of Sn is contained using resistive heating method in an atmosphere of oxygen gas at $5 \times 10^{-3}$ Torr, the generation rate of white blemishes in the A' area of the photoconductive image pickup tube mainly made of amorphous Se and with that transparent electrode and the temperature of the substrate in the formation of the transparent electrode. When the substrate temperature is lower than 80° C., the resistivity is high undesirably whereas when it is higher than 400° C., white blemishes increase in number. Therefore, the appropriate temperature of the substrate in the formation of the transparent electrode is 80°–400° C., and preferably 100°–200° C. The transparent electrode formed in this range of temperatures has a transmittance of 85% or more for visible light.

Figure 7:
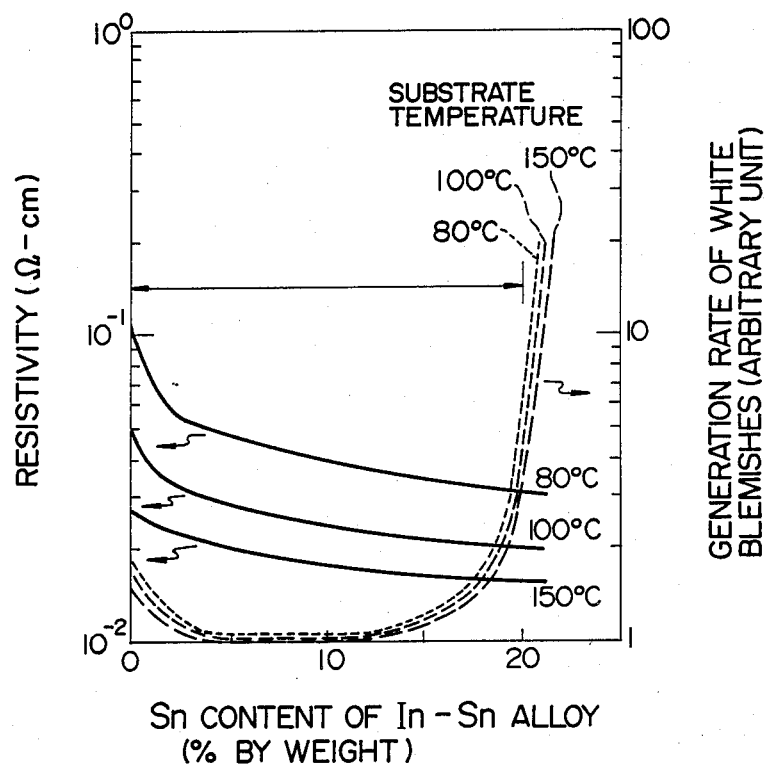
FIG. 7 illustrates the relationship among the composition and resistivity of a transparent electrode according to the present invention and the picture defect characteristic of the resulting image pickup tube thereof.

FIG. 7 illustrates the relationship among the resistivity of a transparent electrode formed by the evaporation of an In - Sn alloy on the substrate using resistive heating method at each of substrate temperatures of 80°, 100° and 150° C. in an atmosphere of oxygen gas at $5 \times 10^{-3}$ Torr, the generation rate of white blemishes in the A' area in the photoconductive image pickup tube mainly made of amorphous Se and with that transparent electrode, and the Sn content of the In - Sn alloy. As the Sn content increases, the resistivity tends to decrease, so that the electrode changes in a more preferable direction. However, if the Sn content exceeds 20% by weight, picture defects are likely to occur, so that an appropriate Sn content is 20% by weight or less and preferably 2–15% by weight. The transparent electrode formed in this range is a very excellent one with a transmittance of 85% or more for visible light.

Figure 8:
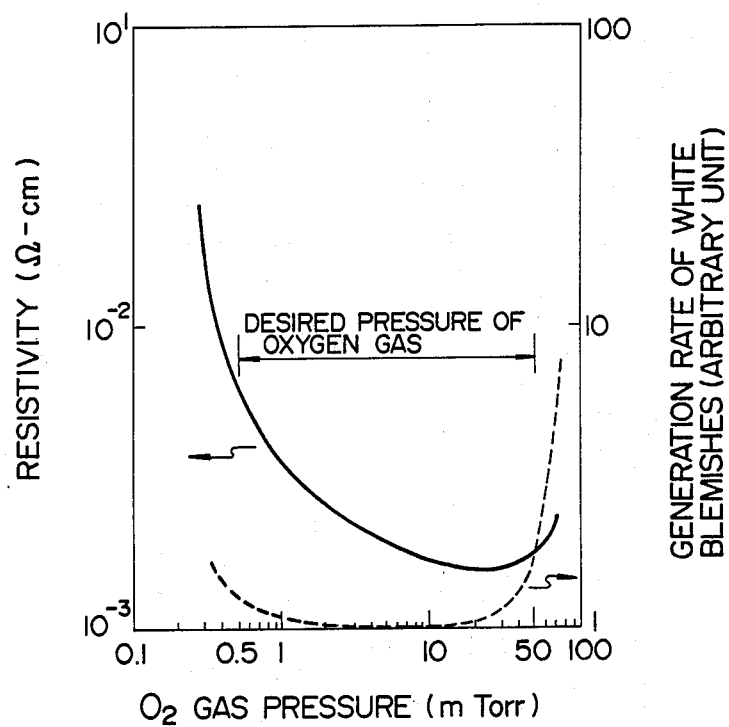
FIG. 8 illustrates the relationship among the oxygen gas pressure and resistivity in the formation of a transparent electrode according to the present invention and the picture defect characteristic of the resulting image pickup tube thereof.

FIG. 8 illustrates the relationship among the resistivity of a transparent electrode formed by the evaporation of an In - Sn alloy in which 10% by weight of Sn is contained at a substrate temperature of 200° C. by resistive heating method, the generation rate of white blemishes in the A' area in the photoconductive image pickup tube mainly made of amorphous Se and with that transparent electrode and the pressure of oxygen gas in the formation of the transparent electrode. As will be seen in FIG. 8, if the pressure of oxygen gas is lower than $5 \times 10^{-4}$ Torr, the resistivity rapidly increases as the gas pressure decreases whereas if it is higher than $5 \times 10^{-2}$ Torr, white blemishes rapidly increase in number, so that a desired pressure of oxygen gas in the formation of the transparent electrode is $5 \times 10^{-4} - 5 \times 10^{-2}$ Torr. The transparent electrode formed in this range has a transmittance of 85% or more for visible light.

EXAMPLE 1

The cross section of the target in the particular example is as shown in FIG. 1A.

The surface of a transparent glass substrate is ion etched away by 0.5 μm in the RF sputtering apparatus shown in FIG. 2. In the ion etching, the inside of the sputtering apparatus is beforehand evacuated so as to have a vacuum of $2 \times 10^{-6}$ Torr or less, argon gas is introduced in the apparatus such that the pressure of argon gas within the apparatus is $3.0-5.0 \times 10^{-4}$ Torr, the aperture in the main valve is then adjusted such that the internal pressure of the apparatus is $3 \times 10^{-3}$ Torr. The substrate holder 11 is then cooled, and the surface of the transparent glass substrate 13 (the glass substrate 1 in FIG. 1A) is ion etched away at a discharge power of 1.0–2.0 Watt/cm$^2$. The etching rate at this time is 2–5 nm/min.

A transparent conductive film 2 mainly containing indium oxide and having a thickness of 50 nm is formed by sputtering on the thus prepared transparent glass substrate 1. A hole blocking layer 3 of CeO$_2$ and having a thickness of 20 nm and an amorphous Se film 4 having a thickness of 2 μm are formed by deposition on the transparent photoconductive film 2. An electron blocking layer 5 of Sb$_2$S$_2$ and having a thickness of 100 nm is deposited on the amorphous Se film 4 in an atmosphere of Ar gas at $2 \times 10^{-1}$ Torr to thereby complete an image pickup tube target. This target is incorporated into a regular image pickup tube housing having a built-in electron gun to thereby form a photoconductive image pickup tube. FIG. 10 schematically illustrates the cross section of this image pickup tube wherein reference numerals 20, 21, 22 and 23 denote the target, electron gun, image pickup tube housing and electrons emitted by the electron gun, respectively.

EXAMPLE 2

In Example 2, the cross section of the target is shown in FIG. 1A and the internal state of the deposition device is shown in FIG. 3.

A transparent electrode 2 mainly made of indium oxide and having a thickness of 50 nm is formed on a transparent glass substrate 1 by the resistive heating and deposition apparatus shown in FIG. 3. In the deposition, the bell jar is evacuated so as to have a vacuum of $5.0 \times 10^{-6}$ Torr or less while the substrate (18 in FIG. 3) is then beforehand being heated to 150° C., the substrate 18 is then maintained at 150° C., and oxygen gas is introduced such that the pressure in the bell jar is $5.0 \times 10^{-3}$ Torr. An In - Sn alloy at the boat 14 in which the alloy contains 10% by weight of Sn is melted and evaporated, and a shutter 16 is opened such that the transparent electrode 2 mainly made of indium oxide and having a thickness of 50 nm is formed on the substrate 18 (1 in FIG. 1A) by deposition.

A hole blocking layer 3 of CeO$_2$ and having a thickness of 20 nm and a photoconductive amorphous Se film 4 having a thickness of 4 μm are formed by deposition on the transparent electrode 2 thus prepared. An electron blocking layer 5 of Sb$_2$S$_3$ and having a thickness of 100 nm is deposited on the amorphous Se film 4 in an atmosphere of Ar gas at $2 \times 10^{-2}$ Torr to thereby complete an image pickup tube target. This target is incorporated into a regular image pickup tube housing having a built-in electron gun to provide a photoconductive image pickup tube of a blocking type structure.

EXAMPLE 3

This example uses both the steps of ion etching away the surface of a transparent glass substrate and forming a transparent electrode in an atmosphere containing oxygen as the main component.

The surface of a transparent glass substrate is ion etched away in a manner similar to that used in Example 1. A transparent electrode mainly containing indium oxide is further formed on the substrate, thus obtained, in a manner similar to that used in Example 2. A hole blocking layer of CeO$_2$ and having a thickness of 15 nm is then formed on the transparent electrode by vacuum deposition. A Se - As amorphous film containing 2% by weight of As and having a thickness of 3 μm is deposited on the hole blocking layer by vacuum deposition. In this case, Se and As$_2$Se$_3$ are evaporated simultaneously from separate boats to thereby form the amorphous layer. An electron blocking layer of Sb$_2$S$_3$ having a thickness of 80 nm is formed on the amorphous layer in an atmosphere of Ar gas at $2\times10^{-2}$ Torr to complete the target of an image pickup tube. This target is incorporated into a regular image pickup tube housing which has a built-in electron gun to thereby provide a photoconductive image pickup tube of a blocking structure.

EXAMPLE 4

Figure 9A:
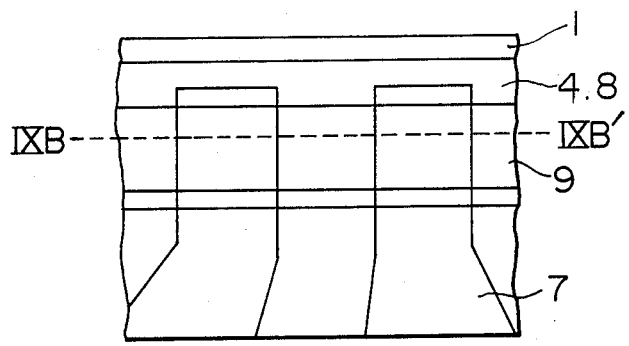
FIGS. 9A and 9B illustrate the structure of an example of one-dimensional linear image sensors according to the present invention.
Figure 9B:
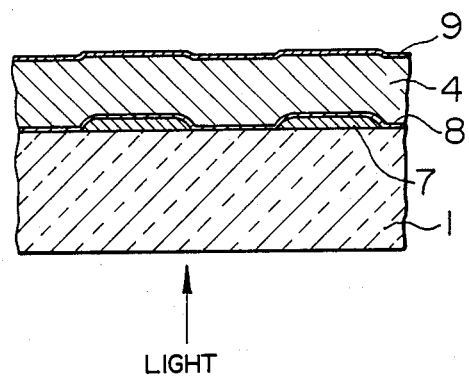

FIGS. 9A and 9B illustrate a one-dimensional linear image sensor in which the present invention is carried out, wherein FIG. 9A is a schematic view of part of the flat surface of the sensor and FIG. 9B is a cross section view taken along the broken line IXB-IXB' of FIG. 9A.

The ion etching away of the surface of a glass substrate 1 and the formation of a transparent electrode mainly made of indium oxide are performed in a manner similar to those used in Examples 1 and 2. At this time the transparent electrode should have a thickness of 100 nm. The transparent electrode is divided by photoetching to form individual signal electrodes 7. $CeO_2$ films having a thickness of 20 nm as an electron blocking layer 8 is deposited on the respective electrodes 7 through a mask having elongated apertures. An amorphous Se - As or Se - Ge semiconductor layer of a thickness of 5 μm as a photoconductive film 4 is deposited on the electron blocking layer 8 by vaporization of Se and $As_2Se_3$ or Se and Ge from separate ports. In this case, the density of As or Ge should be 1% by weight. A conductive film 9 of Au or Al is deposited on the photoconductive layer film 4 in a manner such as sputtering to form a photoconductive conversion section. Reading electrodes for the photoelectric conversion section are then connected to a scanning circuit provided on the substrate by appropriate means such as bonding to provide a one-dimensional linear image sensor according to the present invention.

When each of the photosensors obtained by the Examples 1 and 4 was operated by application of an electric field higher than $8\times10^7$ V/m thereto, charge multiplication occurred in the amorphous semiconductor layer. For example, an output having a gain of about 10 was obtained under conditions in which picture defects or element breakage was suppressed under an applied electric field, for example, of $1.2\times10^8$ V/m.

As is clear from the above, photosensors which improved picture defects were provided according to the present invention. Easy breakage of the photoconductive films due to insulation breakage was prevented. The photosensors operated satisfactorily under conditions where the gain was especially higher than 1 (unity).

What is claimed is:

1. A method of making a photosensor, comprising the steps of:
    ion etching away a predetermined surface of a substrate;
    forming an electrode on the etched-away surface of the substrate; and
    forming on the electrode a photoconductive layer mainly made of an amorphous semiconductor such that the photoconductive layer is put in rectifying contact with the electrode.

2. A method according to claim 1, wherein a quantity by which the surface of the substrate is etched away is 0.1-10 μm.

3. A method of making a photosensor, comprising the steps of:
    ion etching away a predetermined surface of a transparent substrate;
    forming an electrode on the etched-away surface of the substrate;
    forming a hole blocking layer on the electrode; and
    forming on the hole blocking layer a photoconductive layer mainly made of an amorphous semiconductor.

4. A method according to claim 3, further including a step of forming an electron blocking layer on the photoconductive layer.

5. A method according to claim 3, wherein a quantity by which the surface of the substrate is etched away is 0.1-10 μm.

6. A method according to claim 4, wherein a quantity by which the surface of the substrate is etched away is 0.1-10 μm.

7. A method of making a photosensor, comprising the steps of:
    ion etching away a predetermined surface of a substrate;
    forming an electrode by depositing a metal material mainly containing indium on the substrate in an oxidizing atmosphere; and
    forming on the electrode a photoconductive layer mainly containing an amorphous semiconductor such that the photoconductive layer is put in rectifying contact with the electrode.

8. A method of making a photosensor, comprising the steps of:
    ion etching away a predetermined surface of a transparent substrate;
    forming on the substrate an electrode by depositing a metal material mainly containing indium in an oxidizing atmosphere;
    forming a hole blocking layer on the electrode;
    forming on the hole blocking layer a photoconductive layer mainly containing an amorphous semiconductor; and
    forming an electron blocking layer on the photoconductive layer.

9. A method according to claim 8, wherein a quantity by which the surface of the substrate is ion etched away is 0.1-10 μm.

10. A method according to claim 8, the temperature of the substrate heated when the metal material mainly containing indium is deposited is 80°-400° C.

11. A method according to claim 8, wherein the metal material mainly containing indium includes an In - Sn alloy in which 20% by weight of Sn is contained.

12. A method according to claim 8, wherein the oxidizing atmosphere is at a pressure of $5\times10^{-4}$-$5\times10^{-2}$ Torr.

* * * * *